US008734010B2

(12) United States Patent
Tsuchiya

(10) Patent No.: US 8,734,010 B2
(45) Date of Patent: May 27, 2014

(54) THERMAL DETECTOR, THERMAL DETECTION DEVICE, ELECTRONIC INSTRUMENT, AND THERMAL DETECTOR MANUFACTURING METHOD

(75) Inventor: Yasushi Tsuchiya, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 336 days.

(21) Appl. No.: 13/329,498

(22) Filed: Dec. 19, 2011

(65) Prior Publication Data

US 2012/0163410 A1  Jun. 28, 2012

(30) Foreign Application Priority Data

Dec. 22, 2010 (JP) ................................. 2010-286334
Dec. 27, 2010 (JP) ................................. 2010-289491
Dec. 27, 2010 (JP) ................................. 2010-289492
Jan. 24, 2011 (JP) ................................. 2011-012060
Feb. 23, 2011 (JP) ................................. 2011-036886

(51) Int. Cl.
  *G01J 5/00* (2006.01)
(52) U.S. Cl.
  USPC ........................................ 374/121; 250/338.3
(58) Field of Classification Search
  USPC ........................................ 250/338.3; 374/121
  See application file for complete search history.

(56) References Cited

U.S. PATENT DOCUMENTS 6,465,784 B1 * 10/2002 Kimata ........................ 250/332
8,283,633 B2 * 10/2012 Myrick et al. .............. 250/338.1
8,502,149 B2 * 8/2013 Tsuchiya ..................... 250/338.3
8,569,698 B2 * 10/2013 Takizawa et al. ........... 250/338.3
8,581,192 B2 * 11/2013 Noda et al. .................. 250/338.3
2011/0233408 A1 * 9/2011 Noda et al. .................. 250/338.3
2012/0018635 A1 * 1/2012 Takizawa et al. ........... 250/338.3
2012/0161003 A1 * 6/2012 Tsuchiya ..................... 250/338.3
2012/0161004 A1 * 6/2012 Tsuchiya ..................... 250/338.3
2012/0161005 A1 * 6/2012 Tsuchiya ..................... 250/338.3
2012/0161006 A1 * 6/2012 Tsuchiya ..................... 250/338.3
2012/0163410 A1 * 6/2012 Tsuchiya ........................ 374/121

FOREIGN PATENT DOCUMENTS

JP    2000-019010 A   1/2000
JP       3339276 B2  10/2002
WO    WO-99/31471 A1  6/1999

* cited by examiner

*Primary Examiner* — Lisa Caputo
*Assistant Examiner* — Jamel Williams
(74) *Attorney, Agent, or Firm* — Global IP Counselors, LLP

(57) ABSTRACT

A thermal detector includes a substrate, a support member, a heat-detecting element, a thermal transfer member, a first light-absorbing layer and a second light-absorbing layer. The support member is supported on the substrate so that a cavity is formed between the substrate and the support member. The heat-detecting element is supported on the support member. The thermal transfer member includes a connecting portion connected to the heat-detecting element and a thermal collecting portion formed over the heat-detecting element and having a surface area larger than a surface area of the connecting portion as seen in plan view. The first light-absorbing layer contacts the thermal transfer member and disposed between the thermal transfer member and the support member. The second light-absorbing layer contacts the thermal transfer member and disposed on the thermal transfer member.

20 Claims, 8 Drawing Sheets

P1: Resonance Peak Of First Resonator
P2: Resonance Peak Of Second Resonator
P3: Detection Sensitivity Of Thermal Detector

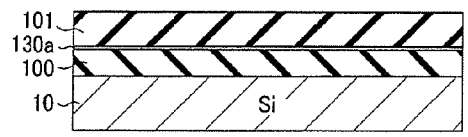
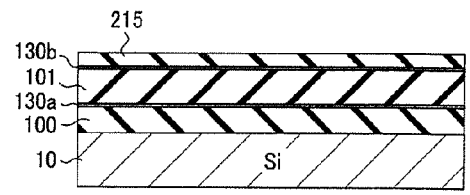
Fig. 3A
Fig. 3B
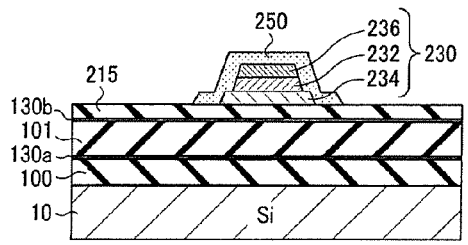
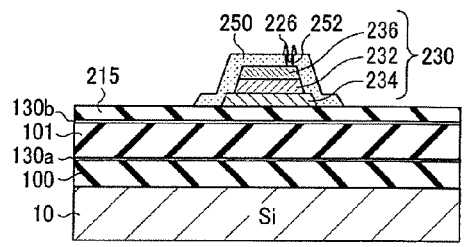
Fig. 3C
Fig. 3D
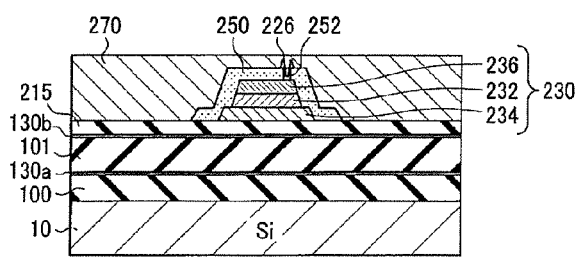
Fig. 3E

THERMAL DETECTOR, THERMAL DETECTION DEVICE, ELECTRONIC INSTRUMENT, AND THERMAL DETECTOR MANUFACTURING METHOD

CROSS-REFERENCE TO RELATED APPLICATIONS

This application claims priority to Japanese Patent Application No. 2010-286334 filed on Dec. 22, 2010, Japanese Patent Application No. 2010-289491 filed on Dec. 27, 2010, Japanese Patent Application No. 2010-289492 filed on Dec. 27, 2010, Japanese Patent Application No. 2011-012060 filed on Jan. 24, 2011 and Japanese Patent Application No. 2011-036886 filed on Feb. 23, 2011. The entire disclosures of Japanese Patent Application Nos. 2010-286334, 2010-289491, 2010-289492, 2011-012060 and 2011-036886 are hereby incorporated herein by reference.

BACKGROUND

1. Technical Field

The present invention relates to a thermal detector, a thermal detection device, an electronic instrument, and a thermal detector manufacturing method.

2. Related Art

Thermal detection devices are known as light sensors. Thermal detectors absorb light that has been emitted from an object in a light-absorbing layer, convert the light to heat, and measure the change in temperature with a heat-detecting element. Thermal detectors include thermopiles that directly detect the increase in temperature accompanying light absorption, pyroelectric-type elements that detect a change in electrical polarity, and bolometers that detect the increase in temperature as a change in resistance. Thermal detectors have a characteristically wide wavelength range over which measurements can be made. In recent years, semiconductor fabrication technologies (e.g., MEMS technologies) have been used, and the production of smaller-scale thermal detectors has been attempted.

In order to increase detection sensitivity and improve response in thermal detectors, it is critical to efficiently transfer the heat that is generated in the light-absorbing layer to the heat-detecting element.

The structure of a heat-detecting element for improving thermal transfer efficiency is described, for example, in Japanese Patent No. 3339276. The infrared detecting element described in Japanese Patent No. 3339276 (herein referred to as a thermopile-type infrared detecting element) has a highly thermally conducting layer that is provided between an infrared light sensing part and an infrared light absorbing layer. Specifically, a membrane is formed over a cavity, and the membrane is supported on the surrounding substrate by protruding beams that are provided at the four corners. The center membrane portion has a highly thermally conducting layer and an infrared light absorbing layer, and the edge portions have thermopile elements. In addition, the highly thermally conducting layer is made from a material having excellent infrared light reflectance, such as aluminum or gold.

SUMMARY

In addition, with the infrared light detecting element described in Japanese Patent No. 3339276, a high thermal transfer member is provided under the light-absorbing layer, but the heat-detecting element is not provided below the light-absorbing layer and the high thermal conduction member. The infrared light absorbing layer is at a position that is separated from the infrared sensing part of the heat-detecting element, and so the heat that is generated in the infrared light absorbing layer cannot be supplied, in some cases, directly to the heat-detecting element infrared light sensing part.

With the infrared light solid-state image capture element described in Japanese Patent Application Republication No. 99/31471, an insulating layer that constitutes an infrared light-absorbing part is in a position that is separated from the temperature detector, and so the heat that is generated in the insulating layer of the infrared light absorbing part, in some cases, cannot be supplied directly to the temperature detector.

In accordance with at least one aspect of the present invention, it is possible to increase the detection sensitivity of a thermal detector.

A thermal detector according to one aspect of present invention includes a substrate, a support member, a heat-detecting element, a thermal transfer member, a first light-absorbing layer and a second light-absorbing layer. The support member is supported on the substrate so that a cavity is formed between the substrate and the support member. The heat-detecting element is supported on the support member. The thermal transfer member includes a connecting portion connected to the heat-detecting element and a thermal collecting portion formed over the heat-detecting element and having a surface area larger than a surface area of the connecting portion as seen in plan view. The first light-absorbing layer contacts the thermal transfer member and disposed between the thermal transfer member and the support member. The second light-absorbing layer contacts the thermal transfer member and disposed on the thermal transfer member.

The thermal detector of this aspect includes the heat-transfer member that is made from a thermally conductive material. The heat-transfer member has a connecting portion that connects to the heat-detecting element and a thermal collecting portion that is formed over the heat-detecting element and also has a surface area that is greater than the connecting portion, as seen in plan view. As used herein the terms "over" and "on" are to be broadly interpreted as both including the meanings "directly on" and "in the upper part of" (where an interlayer or the like is interposed between the layers or the parts). The thermal collecting portion of the thermal transfer member, for example, may be provided between the lower first light-absorbing layer and the upper second light-absorbing layer.

The thermal collecting portion of the heat transfer member, for example, has the role of collecting the heat that has been generated over a large region and transferring it the heat-detecting element. In some cases, the collecting portion is formed, for example, in a mode in which it has a flat surface and is formed on a planarized first light-absorbing layer. In this case, "collecting portion" can also be expressed as "level part" or "flat part". In this case, the collecting portion can be provided parallel to the support member. In other words, the surface of the collecting portion (top surface or bottom surface) can be disposed in parallel with the surface (top surface or bottom surface) of the support member.

In addition, the thermal transfer member, for example, can be transmissive with respect to light of at least some of the wavelengths in the wavelength range in which the thermal detector has detection sensitivity. As used herein, the term "transmissive" includes "semi-transmissive". In this case, the thermal transfer member can be, for example, a metal compound that has favorable thermal conduction and is semi-transmissive with respect to light (e.g., MN or $AlO_x$). Alternatively, the thermal transfer member may also be formed from a material that reflects light such as a metal (e.g., aluminum).

When the thermal transfer member is transmissive with respect to light, for example, the light that is incident on the thermal detector (e.g., infrared light), more specifically, a portion of the light that is incident in the region of the support member (membrane), will be absorbed by the second light-absorbing layer, and the rest will reach the thermal transfer member without being absorbed. A portion of the light that has reached the thermal transfer member will be reflected, and the rest of the light will pass through the thermal transfer member. The light that has been reflected by the thermal transfer member will be absorbed by the second light-absorbing layer.

A portion of the light that passes through the thermal transfer member will be absorbed by the first light-absorbing layer, and the rest will reach the surface of the support member (the interface of the first light-absorbing layer and the support member) and the heat-detecting element that is mounted on the support member. A portion of the light that reaches the surface of the support member (interface of the first light-absorbing layer and the support member) will be reflected and absorbed in the first light-absorbing layer. Of the reflected light, the light that passes through the first light-absorbing layer will reach the second light-absorbing layer and will be absorbed by the second light-absorbing layer.

On the other hand, when the thermal transfer member is made from a material that has light-reflective characteristics such as a metal, the light that is incident on the first light-absorbing layer under the thermal collecting portion will not substantially enter it. In other words, a portion of the light that is incident on the thermal detector (e.g., infrared light) will be absorbed first by the second light-absorbing layer, and the rest will reach the thermal transfer member without being absorbed. The light that has reached the thermal transfer member will be reflected at the surface thereof, and the reflected light will be absorbed by the second light-absorbing layer.

When the thermal transfer member is made from a material that is transmissive with respect to light, then generation of heat in the first light-absorbing layer and the second light-absorbing layer and transfer of the generated heat to the heat-detecting element will occur, for example, in the following manner. Specifically, a portion of the light that is incident on the thermal detector is absorbed in the second light-absorbing layer and heat is generated by the second light-absorbing layer. In addition, the light that has been reflected by the thermal transfer member is absorbed by the second light-absorbing layer and heat is thereby generated by the second light-absorbing layer.

In addition, a portion of the light that has been transmitted by (has passed through) the thermal transfer member is absorbed by the first light-absorbing layer and heat is generated. Moreover, the light that has been reflected at the surface of the support member (interface between the first light-absorbing layer and the support member) is absorbed by the first light-absorbing layer. Moreover, of the light that has been reflected at the surface of the support member, the light that has been transmitted by (has passed through) the first light-absorbing layer progresses to the second light-absorbing layer, where it is absorbed by the second light-absorbing layer. Specifically, the reflected light that has been reflected by the surface of the support member is absorbed by at least one of the first light-absorbing layer and the second light-absorbing layer, and heat is thereby generated by the first light-absorbing layer and the second light-absorbing layer.

The heat that has been generated by the second light-absorbing layer is then transferred efficiently through the thermal transfer member to the heat-detecting element, and the heat that has been generated by the first light-absorbing layer is efficiently transferred, either directly or via the thermal transfer member, to the heat-detecting element. Specifically, the thermal collecting portion of the thermal transfer member is formed so that it covers a large region of the heat-detecting element, and thus most of the heat that has been generated by the first light-absorbing layer and the second light-absorbing layer can be transferred efficiently to the heat-detecting element, regardless of the site at which it was generated. For example, even heat that has been generated at locations that are distant from the heat-detecting element can be efficiently transferred to the heat-detecting element via the thermal transfer member having high thermal conductivity.

Because the collecting portion of the thermal transfer member and the heat-detecting element are connected by the connecting portion of the thermal transfer member, the heat that is transferred via the thermal collecting portion or the thermal transfer member can be directly transferred to the heat-detecting element via the connecting portion. Moreover, because the heat-detecting element is positioned below the thermal transfer member (provided in an overlapping position as seen in plan view), for example, it is possible to connect the middle part of the thermal transfer member and the heat-detecting element by the shortest possible length, as seen in plan view. Thus, the loss occurring with heat transfer can be decreased, and an increase in footprint can be minimized.

On the other hand, when the thermal transfer member is formed from a material that has light-reflecting characteristics such as a metal, as described above, the incident light will not enter the first light-absorbing layer that is below the collecting portion, and the heat will be basically generated at the second light-absorbing layer. This heat will be efficiently transferred to the heat-detecting element via the thermal transfer member. In this case as well, effects are obtained whereby heat that has been generated at points that are distant from the heat-detecting element will be efficiently collected. Moreover, if the surface area of the collecting portion, as seen in plan view, is smaller than the surface area of the first light-absorbing layer as seen in plan view, then the incident light can enter towards the support member via the region in which the collecting portion is not provided (gap region). In this case, heat will be generated by light absorption in the first light-absorbing layer as well, and this heat can be efficiently transferred to the heat-detecting element via the collecting portion.

In the thermal detector of this aspect, the heat that has been generated over a large region in the two-layer (multilayer) light-absorbing layer can be efficiently transferred to the heat-detecting element, and thus the light detection sensitivity of a small-size thermal detector can be greatly increased. Moreover, because the time required for transfer of heat is shortened, the response rate of the thermal detector can be increased.

In addition, in this aspect, absorption efficiency is increased because heat is generated by a two-layer light-absorbing film. Moreover, the heat can be directly transferred to the heat-detecting element via the first light-absorbing layer. Thus, in comparison to the infrared light solid-state image capture element described in patent Japanese Patent Application Republication No. 99/31471 and the infrared light detection element described in Japanese Patent No. 3339276, the detection sensitivity of the thermal detector can be increased. Moreover, in this aspect, the heat-detecting element is connected to the thermal transfer member, and the response rate is thus high, as with the infrared light-detecting element described in Japanese Patent No. 3339276. In this aspect, because the thermal transfer member is directly connected to the heat detecting element, a higher response rate can be obtained in comparison to the infrared light solid state image capture element described in patent Japanese Patent Application Republication No. 99/31471.

In another aspect of the thermal detector of the present invention, the first light-absorbing layer and the second light-absorbing layer are preferably disposed around the heat-detecting element supported on the support member.

In this aspect, the first light-absorbing layer and the second light-absorbing layer are formed surrounding the heat-detecting element. For example, the first light-absorbing layer and the second light-absorbing layer can be formed completely surrounding the heat-detecting element (but the invention is not limited thereby). As a result, the heat that has been generated over a large region of the first light-absorbing layer and the second light-absorbing layer is efficiently transferred to the heat-detecting element, either directly or indirectly via the thermal transfer member. Thus, the light detection sensitivity of the thermal detector can be additionally increased, and the response rate of the thermal detector is improved.

In another aspect of the thermal detector of the present invention, a first optical resonator for a first wavelength is preferably formed between a surface of the support member on which the heat-detecting element is mounted and an upper surface of the second light-absorbing layer, and a second optical resonator for a second wavelength that is different from the first wavelength is preferably formed between a lower surface of the second light-absorbing layer and the upper surface of the second light-absorbing layer.

In another aspect of the thermal detector of the present invention, the heat-detecting element is preferably a pyroelectric capacitor element, a distance between the surface of the support member on which the heat-detecting element is mounted and the upper surface of the second light-absorbing layer is preferably set to $n \cdot (\lambda 1/4)$, where n is an integer equal to or greater than 1 and $\lambda 1$ is the first wavelength, a distance between the lower surface of the second light-absorbing layer and the upper surface of the second light-absorbing layer is preferably set to $n \cdot (\lambda 2/4)$, where $\lambda 2$ is the second wavelength, and the thermal transfer member is preferably made from aluminum nitride or aluminum oxide.

In this aspect, the film thickness of each of the light-absorbing layers is adjusted so that two optical resonators having different resonating wavelengths are produced. As described above, the first optical resonator for the first wavelength is formed between the surface of the support member and the upper surface of the second light-absorbing layer. As described above, the light that has been reflected at the surface of the support member (interface between the first light-absorbing layer and the support member) is absorbed by at least one of the first light-absorbing layer and the second light-absorbing layer, and the effective absorption ratio in the respective light-absorbing layers can be increased, in this case, by providing a first optical resonator.

In this aspect, the thermal collecting portion is preferably provided parallel to the support member. In other words, the surface of the thermal collecting portion (top surface or bottom surface) and the surface of the support member (top surface or bottom surface) are preferably disposed in parallel.

The first optical resonator, for example, can be a so-called $\lambda/4$ optical resonator. Specifically, taking the first wavelength as $\lambda 1$, it is preferable to adjust the film thicknesses of the first light-absorbing layer and the second light-absorbing layer so that the distance between the surface of the support member on which the heat-detecting element is mounted and the upper surface of the second light-absorbing layer (in other words, the total film thickness of the first light-absorbing layer and the second light-absorbing layer) satisfies the relationship: $n \cdot (\lambda 1/4)$ (where n is an integer equal to or greater than 1). As a result, incident light of wavelength $\lambda 1$ and light of wavelength $\lambda 1$ that has been reflected at the surface of the support member are canceled out due to mutual interference, and the effective absorption of the first light-absorbing layer and the second light-absorbing layer will be increased.

Moreover, as described above, the light that has been reflected by the thermal transfer member is absorbed by the second light-absorbing layer, and the effective absorption in the second light-absorbing layer can be increased, in this case, by providing a second optical resonator. For example, a so-called $\lambda/4$ optical resonator may be used as the second optical resonator.

Specifically, taking second wavelength is as $\lambda 2$, the second optical resonator can be constituted by setting the distance between the lower surface of the second light-absorbing layer and the upper surface of the second light-absorbing layer (specifically, the film thickness of the second light-absorbing layer) at $n \cdot (\lambda 2/4)$. As a result, incident light of wavelength $\lambda 2$ and light of wavelength $\lambda 2$ that has been reflected by the lower surface of the second light-absorbing layer (interface between the first light-absorbing layer and second light-absorbing layer) are canceled out due to mutual interference, thereby increasing the effective absorption at the second light-absorbing layer.

Moreover, in this aspect, because a resonance peak is produced at the two different wavelengths, the wavelength band (wavelength range) of light that can be detected by the thermal detector can be increased.

In another aspect of the thermal detector of the present invention, the thermal transfer member preferably also serves as wiring that electrically connects the heat-detecting element to another element.

The thermal transfer member, as described above, can be constituted by a metal compound such as AlN or $AlO_x$. Moreover, when a material having metal as a primary component is used, due to its favorable electrical conductivity, the thermal transfer member may also be used as wiring (or a portion of the wiring) that connects the heat-detecting element with other elements. By using the thermal transfer member as wiring, the production steps can be simplified, because it is not necessary to provide the wiring separately.

A thermal detection device according to another aspect of the present invention includes a plurality of the thermal detectors described in any of the aspects above disposed two-dimensionally.

As a result, a thermal detector (thermal type optical array sensor) is realized in which a plurality of the thermal detectors (thermal type photodetection elements) have been disposed two-dimensionally (e.g., disposed in an array formed along two perpendicular axes).

An electronic instrument according to another aspect of the present invention comprises the thermal detector described in any of the aspects above and a control part configured to process an output of the thermal detector.

The thermal detector according to any of the above described aspects has high detection sensitivity, and thus the performance of the electronic instruments that contain these thermal detectors is improved. Examples of electronic instruments include infrared sensor devices, thermographic devices, on-board automotive night-vision cameras, and surveillance cameras, and the like. The control part may be constituted, for example, by an image processing part or a CPU.

A thermal detector manufacturing method according to another aspect of the present invention includes: forming a structure including an insulating layer on a surface of a substrate; forming a sacrificial layer on the structure including the insulating layer; forming a support member on the sacrificial layer; forming a heat-detecting element on the support member; forming a first light-absorbing layer so as to cover the heat-detecting element; forming a contact hole in a part of the first light-absorbing layer, subsequently forming a material layer having thermal conductivity, and patterning the material layer to form a thermal transfer member having a connecting portion that connects to the heat-detecting element and a thermal collecting portion having a surface area that is greater than that of the connecting portion as seen in plan view; forming a second light-absorbing layer over the first light-absorbing layer and the thermal transfer member; patterning the first light-absorbing layer and the second light-absorbing layer; patterning the support member; and removing the sacrificial layer to form a cavity between the support member and the structure including the insulating layer formed on the surface of the substrate.

In this aspect, a multilayer structure is formed on the primary surface of the substrate which includes an interlayer insulating film, a sacrificial layer, and a support member, with a heat-detecting element, a first light-absorbing layer, a thermal transfer member, and a second light-absorbing layer being layered on this support member. The top surface of the first light-absorbing layer may be planarized by a planarization treatment. In addition, a contact hole is provided in the first light-absorbing layer, and a thermal transfer member connecting portion is embedded in this contact hole. The thermal collecting portion for the thermal transfer member that is provided on the first light-absorbing layer is connected to the heat-detecting element (e.g., the top-side electrode of the pyroelectric capacitor) via the connecting portion. In this aspect, a semiconductor fabrication technology (e.g., an MEMS technology) is used in order to realize a thermal detector that is small and has high detection sensitivity.

In accordance with at last one of the aspects of the present invention, for example, it is possible to additionally increase the detection sensitivity of the thermal detector.

BRIEF DESCRIPTION OF THE DRAWINGS

Referring now to the attached drawings which form a part of this original disclosure:

FIGS. 3A to 3E are diagrams showing the steps for forming the first light-absorbing layer in the thermal detector manufacturing method.

DETAILED DESCRIPTION OF EXEMPLARY EMBODIMENTS

Preferred embodiments of the present invention are described below. The matter of the present invention described in the claims is not unduly limited by the embodiments described below, and it is not essential for all of the configurations described in the embodiments to be used as means for solving the problems.

Embodiment 1

Figures 1A, 1B:
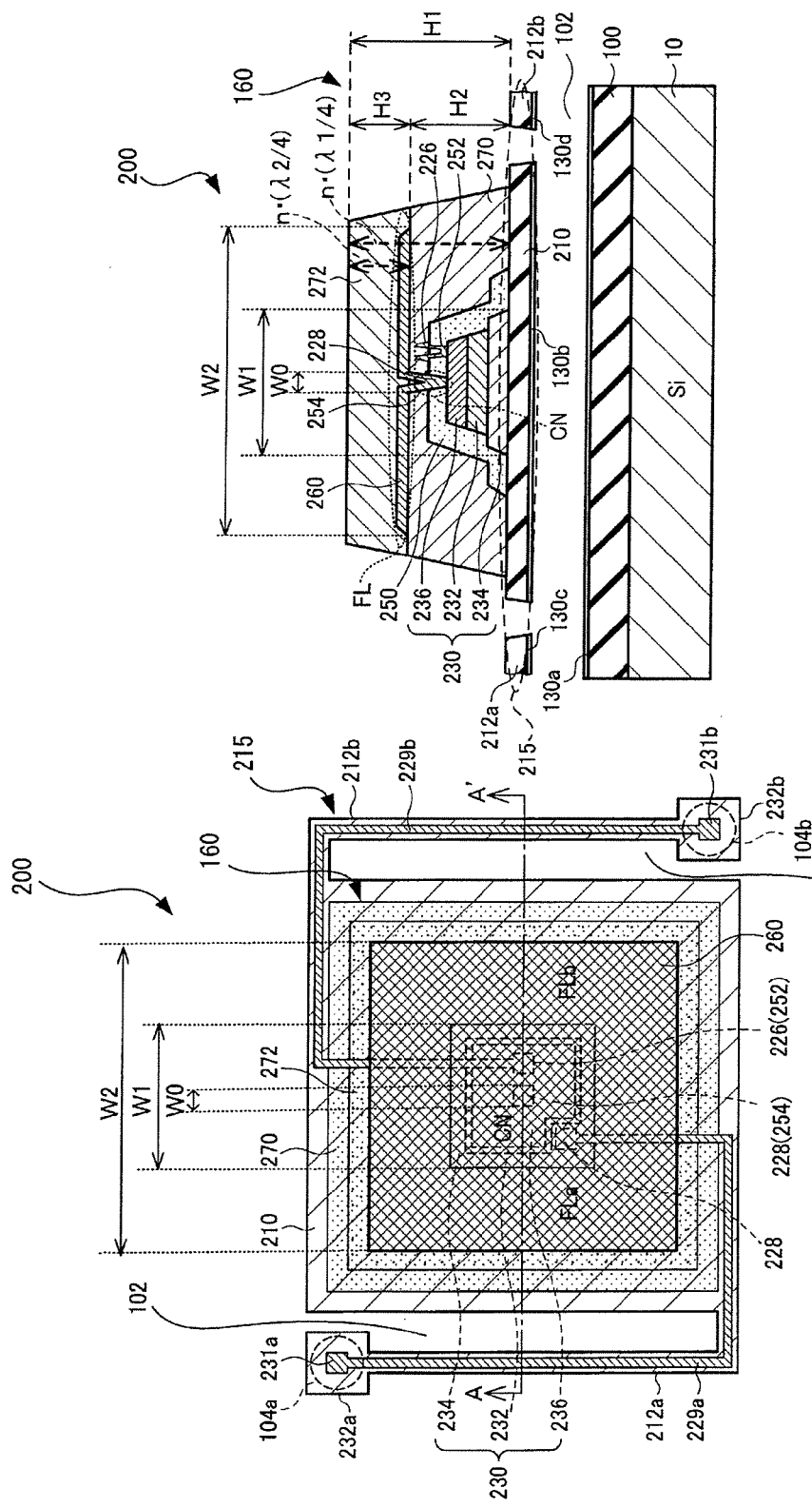
FIG. 1A is a schematic top plan view of an example of a thermal detector according one embodiment.
FIG. 1B is a sectional view of the thermal detector as taken along a section line A-A' in FIG. 1A.

FIGS. 1A and 1B are plan view and a sectional view of an example of the thermal detector. FIG. 1B is a sectional view of the thermal detector, taken along a section line A-A' in FIG. 1A. In FIGS. 1A and 1B, a single thermal detector is shown, but a plurality of thermal detectors may be disposed in the form of a matrix in order to produce the configuration of a thermal detector array (e.g., a thermal detection device).

The thermal detector shown in FIGS. 1A and 1B is a pyroelectric infrared detector 200. The pyroelectric infrared photodetector is a type of light sensor. However, it will be apparent to those skilled in the art from this disclosure that the thermal detector is not limited to the pyroelectric infrared photodetector. In this embodiment, the pyroelectric infrared detector 200 is configured and arranged to efficiently transfer the heat that is generated by light absorption in two-layer light-absorbing films 270 and 272 to the heat-detecting element (here, a pyroelectric capacitor 230) via a thermal transfer member 260 having good thermal transfer properties. In the embodiment described herein, a pyroelectric capacitor is used as the heat-detecting element. However, it will be apparent to those skilled in the art from this disclosure that a thermopile element or bolometer element may be used as the heat-detecting element instead of a pyroelectric capacitor.

The thermal transfer member 260 may be constituted by a material (e.g., a metal compound such as AlN or $AlO_x$) that has high thermal conductivity and that is transmissive (or semi-transmissive) with respect to at least a portion of the light in the wavelength region of the light in the wavelength band (wavelength range) to which the thermal detector has detection sensitivity. Moreover, the thermal transfer member 260 may be constituted by a material that reflects light, such as a metal (e.g., aluminum). The light transmittance of the thermal transfer member 260 is described below in reference to FIG. 2.

The pyroelectric capacitor 230 that is used as the heat-detecting element converts heat into an electrical signal. As a result, a detection signal (e.g., a current signal) is obtained in accordance with the intensity of the received light, as described in detail below.

Example of Thermal Detector (Pyroelectric Infrared Detector)

The sectional structure of the pyroelectric infrared detector 200 will first be described with reference to FIG. 1B.

Sectional Structure of Pyroelectric Infrared Detector

The pyroelectric infrared detector 200 that is used as the thermal detector is constituted by a multilayer structure that is formed on a substrate (silicon substrate) 10. Specifically, the pyroelectric infrared detector 200 that is used as the thermal detector comprises the substrate 10 (in this case, a silicon substrate), a structure 100 including an insulating layer that is formed on a surface (in this case, the top surface) of the substrate 10 (e.g., a multilayer structure including an interlayer insulating film; refer to FIG. 6 for details concerning the multilayer structure), an etching stopper film 130a formed on the surface of the structure 100 including the insulating layer, a cavity 102 for thermal isolation (thermal isolation cavity), a support member 215 (membrane) that is constituted by a mounting part 210 and arm parts 212a and 212b, a pyroelectric capacitor 230 that is formed on the support member 215, an insulating layer 250 that covers the surface of the pyroelectric capacitor, a first light-absorbing layer 270 (e.g., an $SiO_2$ layer), a thermal transfer member 260 (having a connecting portion CN and a pyroelectric part FL), and a second light-absorbing layer 272 (e.g., an $SiO_2$ layer). The first light-absorbing layer 270 is formed in contact with the thermal transfer member 260 in between the thermal transfer member 260 and the support member 215. The second light-absorbing layer 272 is formed on the thermal transfer member 260 and in contact with the thermal transfer member 260.

The base part (base) is constituted by the substrate 10 and the multilayer structure 100. This base part (base) supports an element structure 160 that includes the support member 215 and the pyroelectric capacitor 230 above the cavity 102. In addition, a transistor, resistor, or other well-known semiconductor element can be formed, for example, in the region of the silicon (Si) substrate 10 that overlaps with the heat-detecting element (pyroelectric capacitor 230) as seen in plan view (e.g., refer to the example of FIG. 6).

As described above, an etching stopper film (e.g., an $Si_3N_4$ film) 130a is provided on the surface of the multilayer structure 100 that is formed on the substrate 10. In addition, etching stopper films (e.g., $Si_3N_4$ films) 130b to 130d are formed on the back surface of the support member 215. The etching stopper films 130a to 130d have the role of preventing removal of layers other than the targets of etching in the step in which the sacrificial layer (not shown in FIG. 1, refer to designation 101 in FIG. 3) is etched in order to form the cavity 102. However, the etching stopper film is not necessary, in some cases, depending on the material that constitutes the support member 215.

In addition, the pyroelectric capacitor 230 that is part of the element structure 160 is supported above the cavity 102 by the support member 215 which is also part of the element structure 160.

The support member 215 can be formed by patterning a three-layer laminate of a silicon oxide film (SiO)/silicon nitride film (SiN)/silicon oxide film (SiO). Of course, it will be apparent to those skilled in the art from this disclosure that the structure of the support member 215 is not limited to the one illustrated herein. The support member 215 is configured and arranged to stably support the pyroelectric capacitor 230, and thus the total thickness of the support member 215 is set to be sufficient to provide the necessary mechanical strength.

An oriented film (not shown in the drawings) is formed on the surface of the support member 215, and the pyroelectric capacitor 230 is formed on this oriented film. The pyroelectric capacitor 230 comprises a lower electrode 234 (first electrode), a pyroelectric material layer 232 (e.g., a pyroelectric body PZT layer; lead zirconate titanate layer) that is formed on the lower electrode, and an upper electrode 236 (second electrode) that is formed on the pyroelectric material layer 232.

Each of the lower electrode 234 and the upper electrode 236 can be formed, for example, by laminating three layers of metal film. For example, a three-layer structure may be used in which iridium (Ir), iridium oxide (IrOx) and platinum (Pt) are formed by patterning, for example, in sequence from a location farthest from the pyroelectric material layer (PZT layer) 232. As described above, PZT (Pb(Zi, Ti)$O_3$; lead zirconate titanate) may be used as the pyroelectric material layer 232.

When heat is transferred to the pyroelectric material layer (pyroelectric body), a change in electrical polarity arises in the pyroelectric material layer 232 as a result of the ensuing pyroelectric effect (pyroelectric effect). By detecting the current that accompanies this change in the degree of electrical polarity, it is possible to detect the intensity of the incident light.

This pyroelectric material layer 232 can be formed into a film, for example, by sputtering or MOCVD. The film thickness of the lower electrode 234 and the upper electrode 236 is, for example, about 0.4 μm, and the film thickness of the pyroelectric material layer 232 is, for example, about 0.1 μm.

The pyroelectric capacitor 230 is covered by the insulating layer 250 and the first light-absorbing layer 270. A first contact hole 252 is provided on the insulating layer 250. The first contact hole 252 is used for connecting the electrode 226 of the upper electrode 236 to the upper electrode 236.

Also, the second contact hole 254 is provided in the first light-absorbing layer 270 (and the insulating layer 250). The second contact hole 254 is provided through the first light-absorbing layer 270 and the insulating layer 250. This second contact hole 254 is used in order to connect the thermal transfer member 260 to the upper electrode 236 of the pyroelectric capacitor 230. Specifically, the second contact hole 254 (where the filled portion is indicated by the reference designation 228 in the drawing) can be filled with the same material that constitutes the thermal transfer member 260 (e.g., aluminum nitride (AlN) or aluminum oxide (AlO$_x$), and, as a result, a connecting portion CN is formed in thermal transfer member 260.

Therefore, the thermal transfer member 260 includes a thermal collecting portion FL with a planarized surface that extends over the first light-absorbing layer 270 and the connecting portion CN in the portion that connects the thermal collecting portion FL with the upper electrode 236 in the pyroelectric capacitor 230.

The thermal collecting portion FL of the thermal transfer member 260 is formed over the pyroelectric capacitor 230 used as the heat-detecting element. The description "over the pyroelectric capacitor 230 (or the heat-detecting element)" is to be interpreted broadly as including "directly on the pyroelectric capacitor 230 (or the heat-detecting element)" and "over the pyroelectric capacitor 230 (or the heat-detecting element) (where an interlayer insulating film or the like is interposed between the pyroelectric capacitor 230 (or the heat-detecting element) and the thermal collecting portion FL)". The thermal collecting portion FL of the thermal transfer member 260, for example, is provided between the lower first light-absorbing layer 270 and the second light-absorbing layer 272 in a configuration in which the thermal collecting portion FL is sandwiched by the two absorbing layers. The thermal collecting portion FL, for example, has the role of collecting the heat that has been generated over a wide region and transferring it to the pyroelectric capacitor 230 that is used as the heat-detecting element. The thermal collecting portion FL, for example, can also be formed in a configuration in which it has a level surface on the first light-absorbing layer 270 that has been planarized. In this case, the "thermal collecting portion" may also be referred to as a "flat part" or "planar part".

As described above, the thermal transfer member 260, for example, can be constituted by a material that has high thermal conductivity and is transmissive (semi-transmissive or completely transmissive) with respect to light of a desired wavelength range. In this case, the thermal transfer member 260 can be constituted by aluminum nitride (AlN), aluminum oxide ($AlO_x$), or the like.

When the thermal transfer member 260 is constituted by a material that is transmissive (semi-transmissive or completely transmissive) with respect to light, some of the incident light is transmitted by (passes through) the thermal transfer member 260 and reaches the side of the support member 215. As a result, heat is generated by absorption of light not only in the upper second light-absorbing layer 272, but in the lower first light absorbing layer 270. The thermal collecting portion FL is sandwiched by the first light-absorbing layer 270 and the second light-absorbing layer 272. In other words, the thermal collecting portion FL is in contact with each of the first light-absorbing layer 270 and the second light-absorbing layer 272. Thus, the heat generated respectively in the first light-absorbing layer 270 and the second light-absorbing layer 272 is conducted rapidly to the thermal collecting portion FL and is efficiently transferred to the heat-detecting element 230 via the thermal collecting portion FL having good thermal conductivity.

On the other hand, when the thermal transfer member 260 is constituted by a material that has light-reflective characteristics such as a metal, the incident light is reflected at the surface of the thermal collecting portion FL and is not incident on the first light-absorbing layer 270 under the thermal collecting portion FL. Thus, heat is substantially generated at the second light-absorbing layer 272, and this heat is efficiently transferred to the heat-detecting element 230 via the thermal collecting portion FL of the thermal transfer member 260. In this case as well, an effect is obtained whereby the heat that has been generated at points that are distant from the heat-detecting element 230 is efficiently collected.

However, even when the thermal transfer member 260 is constituted by a metal or the like, for example, if the surface area of the thermal collecting portion FL as seen in plan view is smaller than the surface area of the first light-absorbing layer 270 as seen in plan view, then the incident light can enter towards the support member 215 via the region in which the thermal collecting portion FL has not been provided (gap region). In this case, heat is generated by light absorption in the first light-absorbing layer 270, and this heat can be efficiently transferred to the pyroelectric capacitor 230 via the thermal collecting portion FL.

The material in the thermal collecting portion FL may be different from the material 228 in the connecting portion CN (e.g., the material of the contact plug that is embedded in the contact hole 254).

As shown in FIG. 1B, taking the lateral width of the connecting portion CN as W0, taking the lateral width of the pyroelectric capacitor 230 (in this case, the lateral width of the lower electrode 234 having the greatest lateral width) as W1, and taking the lateral width of the thermal collecting portion FL of the thermal transfer member 260 as W2, the relationship W0<W1<W2 is obtained.

In addition, as shown in FIG. 1B, when the first wavelength is $\lambda 1$, and the second wavelength is $\lambda 2$, the distance H1 between the surface of the support member 215 that supports the pyroelectric capacitor 230 and the upper surface of the second light-absorbing layer 272 (in other words, the total film thickness H1 of the film thickness H2 of the first light-absorbing layer 270 and the film thickness H3 of the second light-absorbing layer 272) is set to $n \cdot (\lambda 1/4)$ (where n is an integer equal to or greater than 1). As a result, a first optical resonator ($\lambda 1/4$ optical resonator) is formed between the surface of the support member 215 on which the pyroelectric capacitor 230 is mounted and the upper surface of the second light-absorbing layer 272.

In addition, the distance H3 between the lower surface of the second light-absorbing layer 272 and the upper surface of the second light-absorbing layer 272 (specifically, the film thickness H3 of the second light-absorbing layer 272) is set to $n \cdot (\lambda 2/4)$. As a result, a second optical resonator ($\lambda 2/4$ optical resonator) is formed between the lower surface of the second light-absorbing layer 272 and the upper surface of the second light-absorbing layer 272. The thermal collecting portion FL of the thermal transfer member 260 in this case is preferably provided parallel to the support member 215. In other words, it is preferable for the surface of the thermal collecting portion FL (upper or lower surface) and the surface of the support member 215 (upper or lower surface) to be disposed in parallel. The effects of configuring the first optical resonator and the second optical resonator are described below.

Layout Configuration of Pyroelectric Infrared Detector

Next, the layout configuration of the pyroelectric infrared detector 200 will be described with reference to FIG. 1A. As shown in FIG. 1A, the support member 215 has a mounting part 210 that supports the pyroelectric capacitor 230 and two arms that hold the mounting part 210 over the cavity 102 (thermal isolation cavity), specifically, a first arm part 212a and a second arm part 212b. The pyroelectric capacitor 230 is formed on the mounting part 210 in the support member 215. In addition, as described above, the configuration of the element structure 160 includes the support member 215, the pyroelectric capacitor 230, the first light-absorbing layer 270, the thermal transfer member 260, and the second light-absorbing layer 272.

The first arm part 212a and the second arm part 212b, as described above, can be formed in long thin shapes by processing involving patterning a three-layer laminated film consisting of a silicon oxide film (SiO), a silicon nitride film (SiN), and a silicon oxide film (SiO). The reason that long thin shapes are produced is to increase thermal resistance and to control heat dissipation (heat release) from the pyroelectric capacitor 230.

The wide distal end part 232a of the first arm part 212a is supported above the cavity 102 by a first post 104a (circular member as seen in plan view, represented by a broken line in FIG. 1A). In addition, wiring 229a is formed on the first arm part 212a that connects one end (reference symbol 228) to the lower electrode 234 of the pyroelectric capacitor 230 and the other end 231a to the first post 104a.

The first post 104a, for example, is provided between the structure 100 that includes the insulating layer shown in FIG. 1B and the distal end part 232a of the first arm part 212a. This first post 104a is constituted by a multilayer wiring structure that has been processed into a pillar shape that is selectively formed in the cavity 102 (composed of an interlayer insulating layer and a conductive layer that constitutes wiring for connecting the elements such as transistors provided on the underlying silicon substrate 10 with the pyroelectric capacitor 230).

Similarly the second arm part 212b is supported above the cavity 102 by a second post 104b (in FIG. 1A, a circular member as seen in plan view, represented by a broken line). The broad distal end part 232b in the second arm part 212b is supported over the cavity 102 by the second post 104b (in FIG. 1A, a circular member as seen in a plan view, represented by a broken line). In addition, wiring 229b is formed on the second arm part 212b that connects one end (reference symbol 226) to the upper electrode 236 of the pyroelectric capacitor 230 and the other end 231b to the second post 104b.

The second post 104b, for example, is provided between the structure 100 that includes the insulating layer shown in FIG. 1B and the distal end part 232b of the second arm part 212b. This second post 104b is constituted by a multilayer wiring structure that has been processed into a pillar shape selectively in the cavity 102 (composed of an interlayer insulating layer and a conductive layer that constitutes wiring for connecting the elements such as transistors provided on the underlying silicon substrate 10 with the pyroelectric capacitor 230).

In the example shown in FIG. 1A, the first post 104a and the second post 104b are used in order to hold the element structure 160 including the support member 215 and the pyroelectric capacitor 230 above the cavity 102. With this configuration, it is useful if a plural number of pyroelectric capacitors 230 used as heat-detecting elements are disposed at high density in a shared cavity 102 (in other words, when forming a heat-detecting element array). However, this configuration is only an example and the present invention is not limited to this configuration. For example, in the example shown in FIG. 6, a single cavity space 102 is formed for each of the pyroelectric capacitors 230 used as the heat-detecting elements, and the support member 215 may be supported by the structure 100 including the insulating layer surrounding the cavity 102.

In addition, in FIG. 1A, the pyroelectric capacitor 230 is disposed in the middle region of the mounting part 210 in the support member 215, and the pyroelectric capacitor 230 has a roughly square shape, as seen in plan view. Moreover, as shown in FIG. 1A, taking the lateral width of the thermal transfer member 269 in the connecting portion CN as W0, taking the lateral width of the pyroelectric capacitor 230 (in this case, the lateral width of the lower electrode 234 having the greatest lateral width) as W1, and taking the lateral width of the thermal collecting portion FL of the thermal transfer member 260 as W2, the relationship W0<W1<W2 is obtained.

Consequently, the surface area of the thermal collecting portion FL of the thermal transfer member 260 as seen in plan view (from a direction perpendicular to the surface of the substrate 10; i.e., as seen perpendicularly from above) is greater than the surface area of the connecting portion CN. In addition, the surface area of the thermal collecting portion FL of the thermal transfer member 260 as seen in plan view is greater than the surface area of the pyroelectric capacitor 230.

In addition, as shown in FIG. 1A, the first light-absorbing layer 270 and the second light-absorbing layer 272 are formed around the pyroelectric capacitor 230 used as the heat-detecting element, which is on the support member 215, as seen in plan view. For example, the first light-absorbing layer 270 and the second light-absorbing layer 272 can be formed completely surrounding the heat-detecting element 230 as seen in plan view (however, the invention is not limited thereto). Consequently, the heat that is generated over a large region of the first light-absorbing layer 270 and the second light-absorbing layer 272 is efficiently transmitted directly to the pyroelectric capacitor 230, or indirectly via the thermal transfer member 260. In other words, the heat that is generated over a large region of the first light-absorbing layer 270 and the second light-absorbing layer 272 is collected from all directions (in other words, from all sides) in the pyroelectric capacitor 230. In this case, the pyroelectric capacitor 230 is disposed below the middle of the roughly square-shaped thermal transfer member 260, as seen in plan view. Thus, the heat that is collected via the thermal transfer member 260 from all directions is transferred to the upper electrode 236 of the pyroelectric capacitor 230 through the shortest possible distance via the connecting portion CN. Thus, much of the heat is efficiently collected from a wide area, and the heat can be transferred to the upper electrode 236 of the pyroelectric capacitor 230 through the shortest possible distance while minimizing loss. Thus, the photodetection sensitivity of the pyroelectric infrared detector 200 can be additionally increased. In addition, the response rate of the pyroelectric infrared detector 200 can be additionally improved.

Operation of Pyroelectric Infrared Detector

The pyroelectric infrared detector 200 according to this embodiment presented in FIGS. 1A and 1B (thermal detector) operates in the manner described below.

For example, when the thermal transfer member 260 is transmissive with respect to light, the light that is incident on the pyroelectric infrared detector 200 (e.g., infrared light), specifically, some of the incident light that is incident on a region of the support member 215 as seen in plan view, is absorbed first by the second light-absorbing layer 272, and the rest is not absorbed and reaches the thermal transfer member 260. The thermal transfer member 260 is transmissive with respect to at least some of the light in the wavelength range to which the pyroelectric infrared detector 200 has detection sensitivity, and, for example, is semi-transmissive with respect to infrared light. At the thermal transfer member 260, some of the light that has arrived is reflected, and the rest is allowed to pass through the thermal transfer member 260. The light that has been reflected at the thermal transfer member 260 is absorbed by the second light-absorbing layer 272 and is converted to heat. Some of the light that has passed through the thermal transfer member 260 is absorbed at the first light-absorbing layer 270 and the rest reaches the surface of the support member 215 (the interface of the first light-absorbing layer 270 and the mounting part 210 in the support member 215) and the pyroelectric capacitor 230 that is used as the heat-detecting element and is mounted on the support member 215.

A large portion of the light that has reached the surface of the support member 215 (the interface between the first light-absorbing layer 270 and the mounting part 210 in the support member 215) is reflected by the support member 215. For example, if the first light-absorbing layer 270 is constituted by an $SiO_2$ layer (refractive index 1.45) and the support member 215 is constituted by an SiN layer (refractive index 2.0), then, because the refractive index of the first light-absorbing layer 270 is greater than the refractive index of the film that constitutes the support member 215 (in other words, the refractive index of the support member 215), most of the light that reaches the support member 215 will be reflected at the surface of the support member 215.

In addition, it is also effective to provide a metal film such as a titanium (Ti) film as an element of the support member 215 (preferably provided on the surface where light is reflected), thereby increasing the light reflectance at the surface of the support member 215.

The light that has reflected at the surface of the support member 215 is absorbed by the first light-absorbing layer 270. Of the reflected light, the light that has passed through the first light-absorbing layer 270 reaches the second light-absorbing layer 272 and is absorbed by the second light-absorbing layer 272.

On the other hand, when the thermal transfer member 260 is constituted by a material that has light-reflecting characteristics such as a metal, the incident light will not substantially enter the first light-absorbing layer 270 below the thermal collecting portion FL. In other words, the light that is incident on the pyroelectric infrared detector 200 (e.g., infrared light), specifically, some of the incident light that is incident in the region of the support member 215 as seen in plan view, will first be absorbed by the second light-absorbing layer 272. The rest will not be absorbed and will reach the thermal transfer member 260 (or the thermal collecting portion FL thereof). The light that has reached the thermal transfer member 260 (or the thermal collecting portion FL thereof) is reflected at its surface, and the reflected light is absorbed by the second light-absorbing layer 272.

However, as described above, even if the thermal transfer member 260 is constituted by a metal or the like, if the surface area of the thermal collecting portion FL as seen in plan view is smaller than the surface area of the first light-absorbing layer 270 as seen in plan view, for example, then the incident light will enter towards the support member 215 through the region in which the thermal collecting portion FL is not provided (gap region). In this case, heat will be generated due to light absorption in the first light-absorbing layer 270 as well, and this heat can be efficiently transferred to the heat-detecting element 230 via the thermal collecting portion FL.

When the thermal transfer member is constituted by a material that is transmissive with respect to light, the generation of heat in the first light-absorbing layer 270 and the second light-absorbing layer 272 and the transfer of the generated heat to the pyroelectric capacitor 230 used as the heat-detecting element occur, for example, in the manner described below. Specifically, some of the light that is incident on the thermal detector 200 is absorbed by the second light-absorbing layer 272, and heat is generated at the second light-absorbing layer 272. In addition, the light that is reflected by the thermal transfer member 260 is absorbed by the second light-absorbing layer 272, and heat is thus generated by the second light-absorbing layer 272.

In addition, some of the light that has been transmitted by (passed through) the thermal transfer member 260 is absorbed by the first light-absorbing layer 270, and heat is generated. In addition, some of the light that has been reflected at the surface of the support member 215 (interface of the first light-absorbing layer 270 and the mounting part 210 of the support member) is absorbed by the first light-absorbing layer 270. In addition, of the reflected light, the light that has passed through the first light-absorbing layer 270 is absorbed by the second light-absorbing layer 272, and heat is generated. Specifically, the light that is reflected at the surface of the support member 215 is absorbed by at least one of the first light-absorbing layer 270 and the second light-absorbing layer 272, and heat is thus generated by the first light-absorbing layer 270 and the second light-absorbing layer 272.

The heat that has been generated by the second light-absorbing layer 272 is efficiently transferred to the pyroelectric capacitor 230 that is used as the heat-detecting element via the thermal transfer member 260, and the heat that has been generated by the first light-absorbing layer 270 is efficiently transferred to the pyroelectric capacitor 230, directly or via the thermal transfer member 260.

Specifically, the thermal collecting portion FL of the thermal transfer member 260 is formed so as to broadly cover the pyroelectric capacitor 230 used as a heat-detecting element, and thus most of the heat that is generated by the first light-absorbing layer 270 and the second light-absorbing layer 272 can be transferred efficiently to the pyroelectric capacitor 230, regardless of the site at which it was generated. For example, even heat that has been generated at a location distant from the pyroelectric capacitor 230 can be efficiently transferred to the heat-detecting element (pyroelectric capacitor) 230 via the thermal transfer member 260 having high thermal conductivity.

In addition, because the thermal collecting portion FL of the thermal transfer member 260 and the pyroelectric capacitor 230 are connected by the connecting portion CN of the thermal transfer member 260, the heat that is transmitted via thermal collecting portion FL of the thermal transfer member 260 can be directly transmitted to the pyroelectric capacitor 230 via the connecting portion CN. Moreover, because the pyroelectric capacitor 230 that is used as the heat-detecting element is positioned under (directly under) the thermal transfer member 260 (provided in positions that are superimposed as seen in plan view), it is possible to connect the pyroelectric capacitor 230 and, for example, the middle part of the thermal transfer member 260 via the shortest possible distance, as seen in plan view. Thus, the loss occurring with heat transfer can be decreased, and an increase in footprint can be minimized.

In this manner, in accordance with the thermal detector illustrated in FIGS. 1A and 1B (in this case the pyroelectric infrared detector 200), the heat that has been generated over a large region in two (a plurality of) light-absorbing layers 270, 272 can be efficiently transferred to the pyroelectric capacitor 230 which is used as the heat-detecting element. Thus, the light detection sensitivity of small-size thermal detectors (e.g., pyroelectric-type infrared photodetectors) can be greatly increased. Moreover, the time required for light transfer is decreased, and so the response rate of the thermal detector can be increased.

In addition, with the thermal detector (in this case the pyroelectric infrared detector 200) described in FIGS. 1A and 1B, the first light-absorbing layer 270 and the second light-absorbing layer 272 are formed around the pyroelectric capacitor 230 used as the heat-detecting element as seen in plan view on the support member 215 (or the mounting part 210 thereof). As a result, the heat that is generated over a large region of the first light-absorbing layer 270 and the second light-absorbing layer 272 is highly efficiently transferred to the pyroelectric capacitor 230 used as the heat-detecting element, either directly or indirectly via the thermal transfer member 260. Thus, the light detection sensitivity of the thermal detector can be additionally increased, and the response rate of the thermal detector can be additionally increased.

Moreover, in this embodiment, heat is generated by two light-absorbing layers 270 and 272, and so the absorption efficiency is increased. The heat can also be directly transferred to the pyroelectric capacitor 230 via the first light-absorbing layer 270. Thus, in comparison to the infrared photodetecting element described in Japanese Patent No. 3339276 and the infrared solid-state image capture element described in Japanese Patent Application Republication No. 99/31471, the detection sensitivity of the thermal-type photodetector can be additionally increased. Moreover, in this embodiment, the heat-detecting element 230 is connected to the thermal transfer member 260. Thus, the response rate is as high as the infrared photodetecting element described in Japanese Patent No. 3339276. In this embodiment, because the thermal transfer member 260 is directly connected to the heat-detecting element 230, a higher response rate is obtained relative to the infrared solid-state image capture element described in Japanese Patent Application Republication No. 99/31471.

As described above, with the thermal detector (in this case the pyroelectric infrared detector 200) described in FIGS. 1A and 1B, the first optical resonator for a first wavelength λ1 is formed between the upper surface of the second light-absorbing layer 272 and the surface of the support member 215 on which the pyroelectric capacitor 230 is supported, and the second optical resonator for a second wavelength λ2 that is different form the first wavelength λ1 is formed between the lower surface of the second light-absorbing layer 272 and the upper surface of the second light-absorbing layer 272. Specifically, by adjusting the film thickness of the first light-absorbing layer 270 and the second light-absorbing layer 272, two optical resonators can be configured that have different resonance wavelengths.

As described above, the light that has reflected at the surface of the support member 215 (the interface between the first light-absorbing layer 270 and the mounting part 210 in the support member 215) is absorbed by at least one of the first light-absorbing layer 270 and the second light-absorbing layer 272, and the effective absorption in the respective light-absorbing layers can be increased by configuring the first optical resonator.

The first optical resonator can be, for example, a so-called λ/4 optical resonator. Specifically, taking the first wavelength as λ1, the film thicknesses of the first light-absorbing layer 270 and the second light-absorbing layer 272 are adjusted so that the distance between the surface of the support member 215 on which the pyroelectric capacitor 230 is mounted and the upper surface of the second light-absorbing layer 272 (in other words, the total film thickness of the first light-absorbing layer 270 and the second light-absorbing layer 272) satisfies the relationship: $n \cdot (\lambda 1/4)$ (where n is an integer equal to or greater than 1). As a result, incident light of wavelength λ1 and light of wavelength λ1, which has been reflected at the surface of the support member 215, cancel each other out due to mutual interference, and the effective absorption of the first light-absorbing layer 270 and the second light-absorbing layer 272 will be increased.

Moreover, as described above, the light that has been reflected at the thermal transfer member 260 is absorbed at the second light-absorbing layer 272, but by constituting the second optical resonator, effective absorption in the second light-absorbing layer 272 can be increased, in this case. A so-called λ/4 optical resonator, for example, may be used as the second optical resonator.

Specifically, taking the second wavelength as λ2, the second optical resonator can be constituted by setting the distance between the lower surface of the second light-absorbing layer 272 and the upper surface of the second light-absorbing layer 272 (specifically, the film thickness of the second light-absorbing layer) to $n \cdot (\lambda 2/4)$. As a result, incident light of wavelength λ2 and light of wavelength λ2, which has been reflected at the lower surface of the second light-absorbing layer (interface between the first light-absorbing layer 270 and the second light-absorbing layer 272) cancel each other due to mutual interference, thereby increasing the effective absorption at the second light-absorbing layer 272.

Moreover, by having a configuration involving two optical resonators, the wavelength bandwidth of light that can be detected by the thermal detector can be increased as a result of peaks synthesis because a resonance peak is produced at the two different wavelengths. In other words, the wavelength bandwidth (wavelength range) that can be detected by the thermal detector can be increased.

Preferred Example of Thermal Transfer Member

A preferred example of the thermal transfer member 260 (thermal transfer layer) is described below. As described above, with the thermal detector 200 of this embodiment, a structure is used in which the thermal collecting portion FL in the thermal transfer member 260 is sandwiched by the first light-absorbing layer 270 and the second light-absorbing layer 272. Thus, in addition, the thermal collecting portion FL of the thermal transfer member 260 can collect even heat that has been generated at positions that are far from the pyroelectric capacitor 230 that is used as the heat-detecting element. As a result, it is preferable for the thermal collecting portion FL to have a large surface area as seen in plan view. Given this situation, it is preferable for the thermal transfer member 260 to be constituted by a material that is transmissive to light and allows light of at least some of the wavelengths that are in the desired wavelength range to pass, so that light that is incident from above the thermal detector 200 is absorbed by both the first light-absorbing layer 270 and the second light-absorbing layer 272.

Specifically, the thermal transfer member 260 is preferably constituted by a material that has thermal conductivity and light transmissivity and has favorable thermal transfer properties. The thermal transfer member 260, can be constituted, for example, by aluminum nitride (AlN) or aluminum oxide ($AlO_x$). The aluminum oxide is also referred to as alumina, and $Al_2O_3$ may also be used, for example.

Figure 2A:
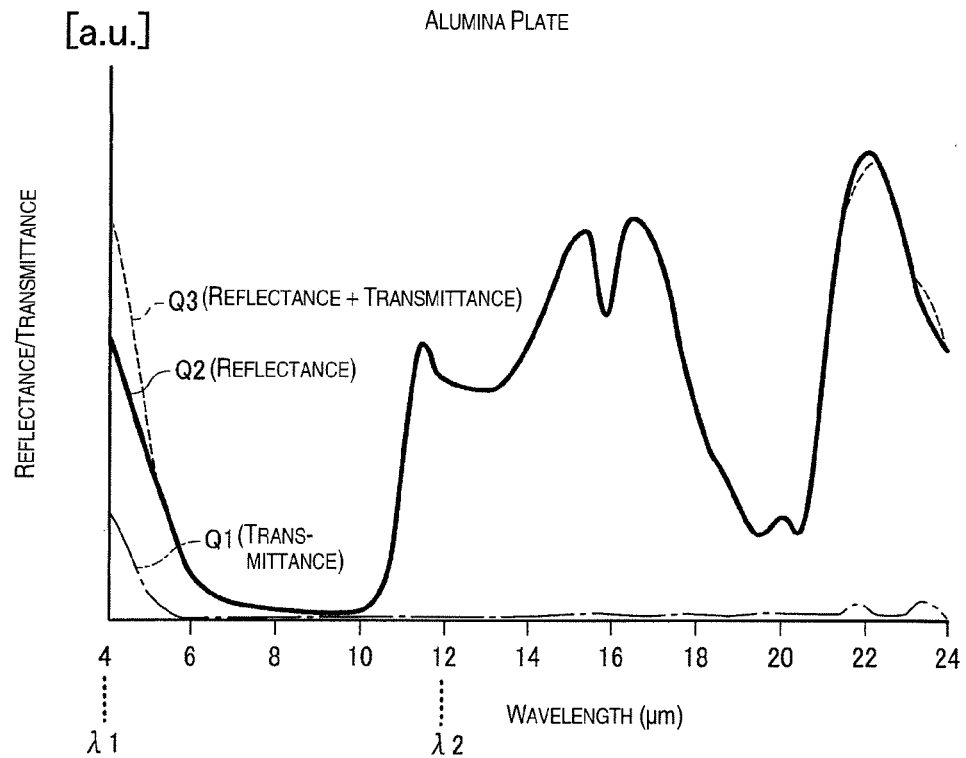
FIG. 2A is a diagram showing an example of the spectral characteristics (light-reflecting characteristics and light-transmission characteristics) of an alumina plate in the far-infrared wavelength range.
Figure 2B:
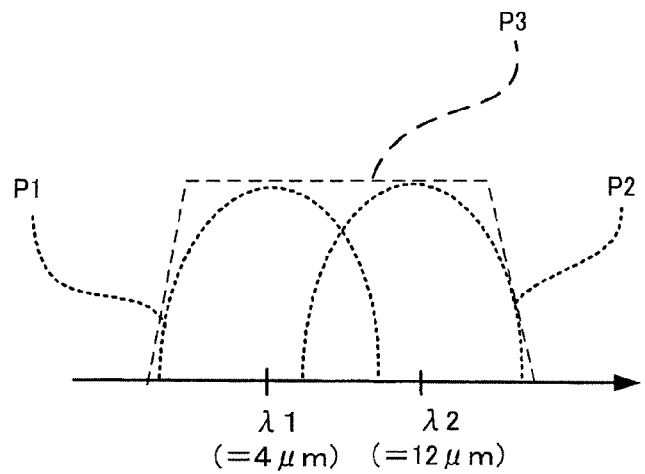
FIG. 2B is a diagram showing an example of the detection sensitivity of the thermal detector having a double optical resonator configuration.

FIG. 2A is a diagram that shows an example of the spectral characteristics (light reflection characteristics and light transmission characteristics) of the alumina plate in the far-infrared light wavelength range and FIG. 2B is a diagram that shows an example of the detection sensitivity of the thermal detector when two optical resonators are configured.

Although the far-infrared light wavelength range is not particularly strictly defined, the wavelength range of far-infrared light is generally about 4 μm to about 1000 μm. Infrared light is radiated by all bodies, and bodies having high temperatures radiate intense infrared light. The wavelength of peak radiation is inversely proportional to temperature, and the peak wavelength of infrared light radiated by a body at room temperature, 20° C., is about 10 μm.

FIG. 2A shows the reflectance and transmittance of an alumina plate in the wavelength range of 4 μm to 24 μm. The horizontal axis is wavelength (μm), and the vertical axis is relative intensity (arbitrary units: a.u.). In FIG. 2A, the characteristic line Q1 indicating transmittance is represented as a dashed-dotted line, and the characteristic curve Q2 indicating reflectance is indicated as a solid line. Characteristic curve Q3 which shows the results of adding the reflectance and the transmittance is represented by a dotted line.

As shown in FIG. 2A, the reflectance varies widely in accordance with wavelength. On the other hand, the transmittance is nearly zero in the wavelength range of 6 μm and above.

Considering the transmittance and reflectance for light of wavelength 4 μm, the transmittance is 0.2 (in other words, 20%), and the reflectance is 0.5 (in other words, 50%). Considering the transmittance and reflectance for light of wavelength 12 µm, the transmittance is nearly 0 (0%), and the reflectance is about 0.43 (43%).

Considering these spectral characteristics, the first wavelength λ1 described above can be set to 4 µm, and the second wavelength λ2 can be set to 12 µm. In this case, if the film thickness of the first light-absorbing layer 270 can be 3 µm, for example, then the film thickness of the second light-absorbing layer 272 can be 1 µm, for example.

When alumina having the spectral characteristics shown in FIG. 2A is used as the material for the thermal transfer member 260, about 50% of the light having a wavelength of the first wavelength λ1 (=4 µm) contained in the incident light is reflected by the thermal transfer member 260 that is formed from alumina, and about 20% of the light having the wavelength of the first wavelength λ1 (=4 µm) contained in the incident light passes through the thermal transfer member 260.

The light of wavelength λ1 that has passed through the thermal transfer member 260 reaches the support member 215 (membrane) and is reflected at the surface thereof, then moves upwards towards the second light-absorbing layer 272, where some of this light is reflected at the upper surface of the second light-absorbing layer 272 (interface between the atmosphere and the second light-absorbing layer 272) and is directed downwards again. In this manner, resonance can arise at wavelength λ1 in the first optical resonator.

In addition, about 43% of the light of wavelength λ2 (=12 µm) contained in the incident light is reflected by the thermal transfer member 260 while there is almost no transmitted light through the thermal transfer member 260, and the reflected light moves upwards through the second light-absorbing layer 272. Some of this light is reflected at the upper surface of the second light-absorbing layer 272 (interface between the atmosphere and the second light-absorbing layer 272), and is again directed downwards. In this manner, resonance can arise at wavelength λ2 in the second optical resonator.

As a result of the generation of optical resonance as described above, the effective light absorption in the first light-absorbing layer 270 and the second light-absorbing layer 272 can be increased.

As shown in FIG. 2B, the wavelength range in which the thermal detector has detection sensitivity can be increased. FIG. 2B is a diagram showing an example of the detection sensitivity of a thermal detector for a case in which two optical resonators are constituted. In the example shown in FIG. 2B, the resonance peak P1 produced by the first optical resonator appears at wavelength λ1 (e.g., λ1=4 µm), and the resonance peak P2 produced by the second optical resonator appears at wavelength λ2 (e.g., λ2=12 µm). By synthesizing these peak characteristics, the detection sensitivity P3 of the thermal detector 200 is widened. In other words, a thermal detector 200 is realized that has detection sensitivity over a broad range of wavelengths. Similar effects can be obtained when aluminum nitride (AlN) is used as the material for the thermal transfer member 260.

In this manner, in accordance with the thermal detector of this embodiment, the heat that is generated at locations distant from the heat-detecting element can be efficiently and rapidly collected in the pyroelectric capacitor 230 that is used as the heat-detecting element through the thermal collecting portion FL of the thermal transfer member (thermal transfer layer) 260. In addition, by utilizing interference between light wavelengths (optical resonance), it is possible to increase the effective absorption of light at the first light-absorbing layer 270 and the second light-absorbing layer 272. It is also possible to widen the wavelength range in which the thermal detector has detection sensitivity.

Thermal Detector Manufacturing Method

The thermal detector manufacturing method is described below with reference to FIGS. 3 to 5. First, FIGS. 3A to 3E will be discussed. FIGS. 3A to 3E are diagrams that show the steps of the thermal detector manufacturing method up until formation of the first light-absorbing layer.

In the step shown in FIG. 3A, a silicon substrate (which may have elements such as transistors) is prepared, and a structure 100 including an insulating layer (e.g., a multilayer wiring structure) is formed on the silicon substrate 10. An etching stopper film 130a is then formed on the structure 100 including the insulating layer, and a sacrificial layer (e.g., an $SiO_2$ layer) 101 is then formed.

In the step of FIG. 3B, an etching stopper film 130b is formed on the sacrificial layer 101. Next, a thick film that will serve as the support member 215 (membrane) (e.g., a thick film composed of a three-layer laminated film) is formed.

In the step of FIG. 3C, a lower electrode 234, a pyroelectric material layer (PZT layer) 232, and an upper electrode 236 are layered on the support member 215 (membrane) to form the pyroelectric capacitor 230 that is used as the heat-detecting element. The method for forming the pyroelectric capacitor 230, for example, can be an atomic layer CVD method. Next, the insulating layer 250 is formed so that it covers the pyroelectric capacitor 230. The insulating layer 250 can be formed, for example, by a CVD method. Next, the insulating layer 250 is patterned.

In the step of FIG. 3D, the first contact hole 252 is formed in the insulating layer 250 that covers the pyroelectric capacitor 230, and a metal material layer is then deposited, whereupon the metal material layer is patterned in order to form the electrode (and wiring) 226 that connects with the upper electrode 236. In the step of FIG. 3D, wiring (not shown in) and an electrode that connects to the lower electrode (first electrode) are formed together.

In the step of FIG. 3E, the first light-absorbing layer (e.g., $SiO_2$ layer) 270 is formed by a CVD method. Next, this surface is planarized by, for example, chemical mechanical polishing (CMP).

Figure 4A:
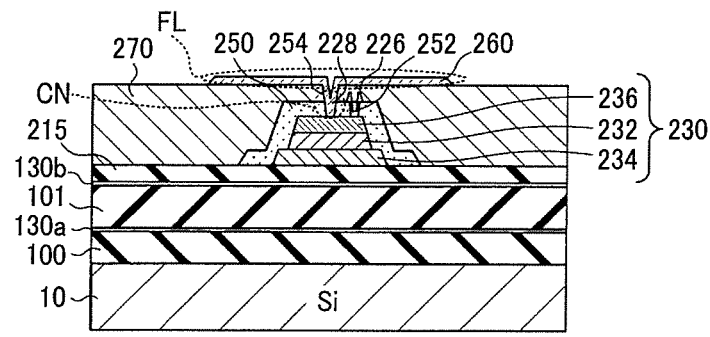
FIGS. 4A to 4C are diagrams showing the steps for patterning the first light-absorbing layer and the second light-absorbing layer in the thermal detector manufacturing method.
Figure 4B:
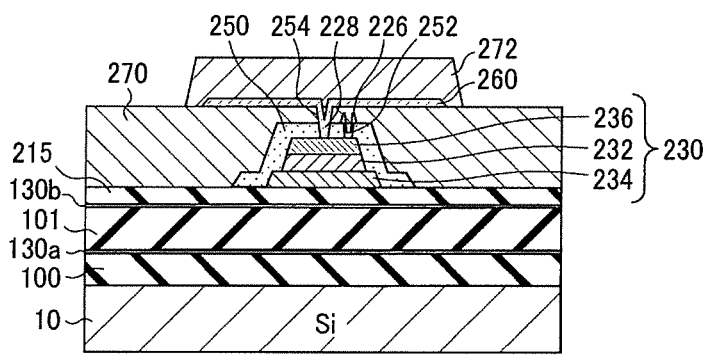
Figure 4C:
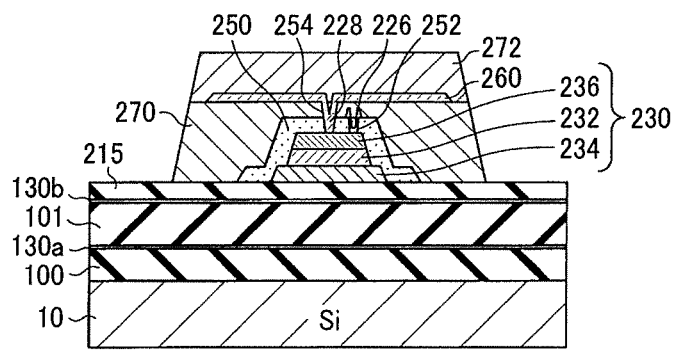

FIGS. 4A to 4C are diagrams that show the steps up to patterning the first light-absorbing layer 270 and the second light-absorbing layer 272 in the thermal detector manufacturing method. In the step of FIG. 4A, the second contact hole 254 is formed in the first light-absorbing layer 270. Next, a material having high thermal conductivity and, for example, light transmissivity, such as aluminum oxide (alumina; $AlO_x$) or aluminum nitride (AlN) is deposited and patterned to form the thermal transfer member 260 (thermal transfer layer). The thermal transfer member 260 has the thermal collecting portion FL and the connecting portion CN. The interior of the second contact hole 254 is filled with a material such as alumina. The connecting portion CN is constituted by the portion 228 that is filled with the material such as alumina.

In the step of FIG. 4B, a material layer that will form the second light-absorbing layer (e.g., $SiO_2$ layer) is deposited and patterned on the first light-absorbing layer 270. As a result, the second light-absorbing layer 272 is formed. In the step of FIG. 4C, the first light-absorbing layer 270 is patterned.

Figure 5A:
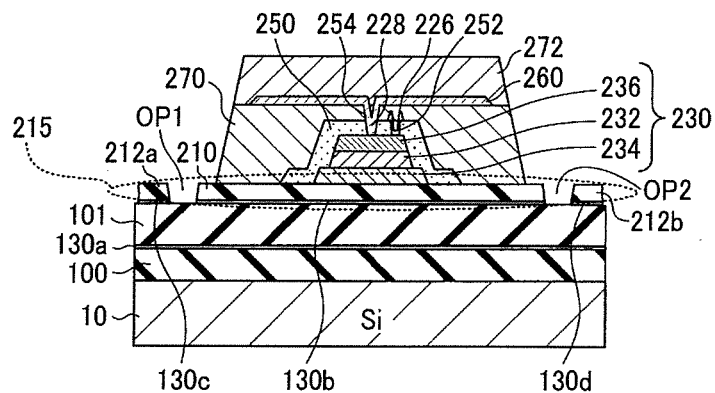
FIGS. 5A and 5B are diagrams showing the steps for completion of the thermal detector in the thermal detector manufacturing method.
Figure 5B:
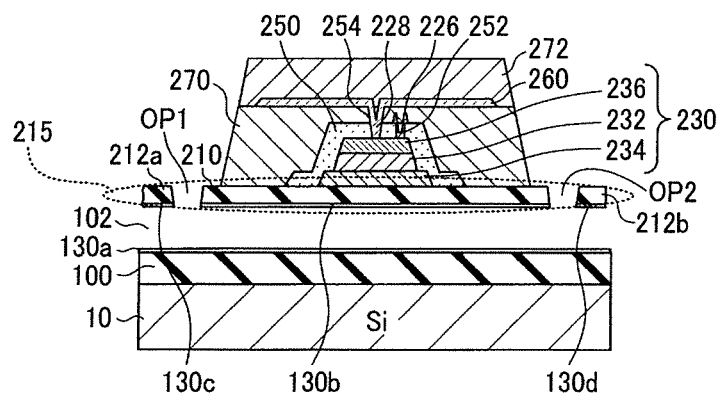

FIGS. 5A and 5B are diagrams that show the steps up to completion of the thermal detector in the thermal-type photodetector manufacturing method. In the step of FIG. 5A, the support member 215 (membrane) is patterned. As a result, the mounting part 210, the first arm part 212a, and the second arm part 212b are formed. In FIG. 5A, the reference symbol OP (OP1 and OP2) is used for the portions that are removed by patterning (openings).

In the step of FIG. 5B, the sacrificial layer 101 is selectively removed by, for example, wet etching. As a result, the cavity (thermal isolation cavity) 102 is formed. The mounting part 210 of the support member 215 is separated from the base part (substrate 10, structure 100 including insulating layer, and etching stopper film 130a) by the cavity 102. Consequently, release of heat through the support member 215 is inhibited. The thermal detector is completed in this manner.

Embodiment 2

Figure 6:
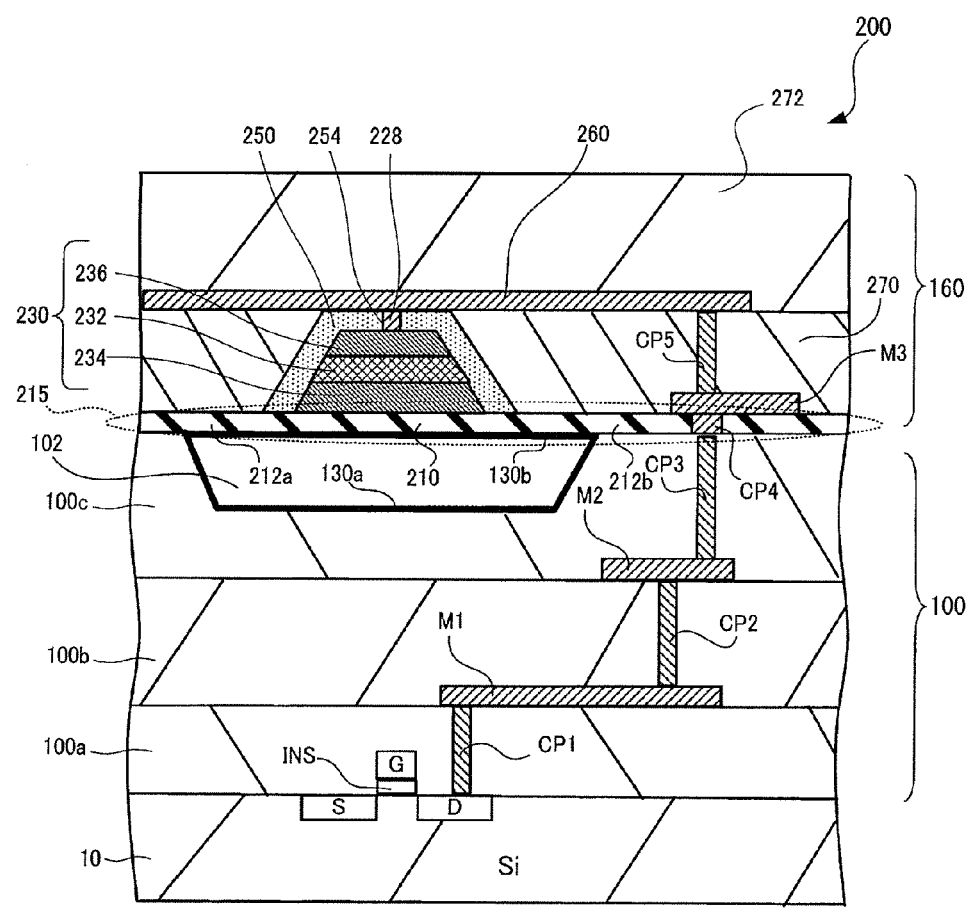
FIG. 6 is a diagram showing another example of the thermal detector.

Referring now to FIG. 6, a thermal detector in accordance Embodiment 2 will now be explained. In view of the similarity between the first and second embodiments, the parts of the second embodiment that are similar or identical to the parts of the first embodiment will be given the same reference numerals as the parts of the first embodiment. Moreover, the descriptions of the parts of the second embodiment that are identical to the parts of the first embodiment may be omitted for the sake of brevity.

FIG. 6 is a diagram showing another example of the thermal detector. With the thermal detector 200 shown in FIG. 6, the cavity 102 is formed for each individual heat-detecting element, and the support member 215 (membrane) is supported by the structure (part of the base part) that surrounds the cavity 102. In addition, a circuit constituent element (in this case, a MOS transistor) is formed in the region overlapping the heat-detecting element as seen in plan view. This MOS transistor is connected via multilayer wiring to the pyroelectric capacitor 230 that is used as the heat-detecting element. In the example of FIG. 6, the thermal transfer member 260 is utilized as wiring.

Specifically, a source layer (S) and a drain layer (D) are formed in the substrate (silicon substrate) 10. In addition, a gate insulating film INS and a gate electrode G (e.g., a polysilicon gate electrode) are formed on the substrate 10. As a result, a MOS transistor that serves as the circuit constituent element is formed.

The structure 100 including the insulating layer is formed on the substrate 10. The base (base) is constituted by the substrate 10 and the structure 100 including the insulating layer.

The structure 100 including the insulating layer is constituted by a multilayered structure, more specifically, a multilayer wiring structure. The multilayer wiring structure comprises a first insulating layer 100a, a second insulating layer 100b, a third insulating layer 100c, a first contact plug CP1, a first layer wiring M1, a second contact plug CP2, a second layer wiring M2, and a third contact plug CP3. Part of the third insulating layer 100c is selectively removed to form the cavity (thermal isolation cavity part) 102.

The pyroelectric capacitor 230 is formed as the heat-detecting element on the mounting part 210 of the support member 215 (membrane). In addition, the thermal transfer member 260 is formed between the first light-absorbing layer 270 and the second light-absorbing layer 272.

The element structure 160 is constituted by the support member 215 (membrane), the pyroelectric capacitor 230, the first light-absorbing layer 270, the second light-absorbing layer 272, the thermal transfer member 260, a fourth contact plug CP4, a third layer wiring M3, and a fifth contact plug CP5. As described above, the thermal transfer member 260 also functions as part of the wiring that connects the pyroelectric capacitor 230 that is used as the heat-detecting element to the other elements (in this case, a CMOS transistor that is formed on the substrate 10).

Specifically, as described above, the thermal transfer member 260 can be constituted by a metal compound such as MN or $AlO_x$, but because materials having metals as primary components also have good electrical conductivity, the thermal transfer member 260 can also be utilized as wiring (or part of the wiring) that connects the heat-detecting element to other elements. By using the thermal transfer member 260 as wiring, it is not necessary to provide separate wiring, and the manufacturing steps can be simplified. In addition, by disposing elements such as transistors in the region overlapping with the heat-detecting element 230 as seen in plan view, increases in the dedicated surface area of the entire thermal detector can be suppressed.

Thermal Detection Device

Figure 7:
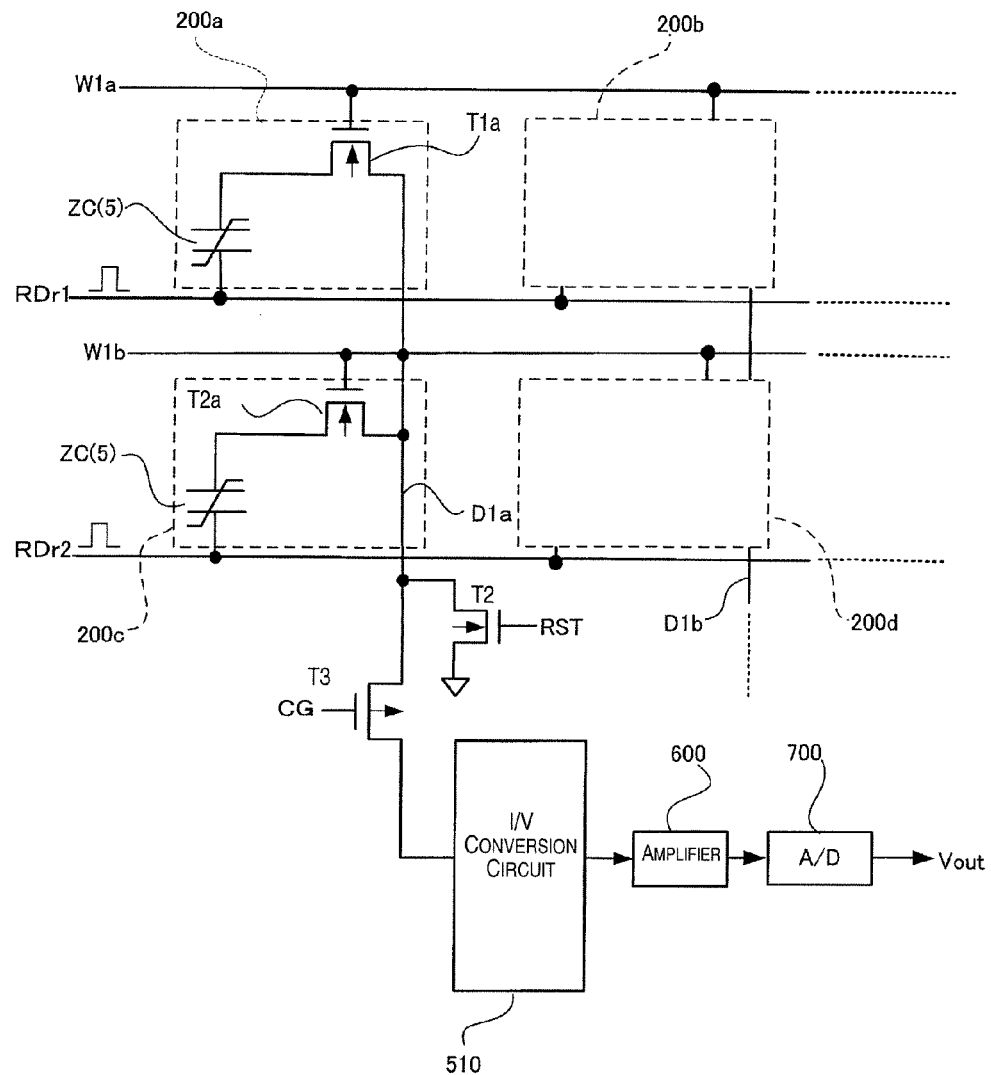
FIG. 7 is a circuit diagram showing an example of the circuit configuration of a thermal detection device (thermal detector array).

FIG. 7 is a circuit diagram that shows an example of a circuit configuration for the thermal detection device (thermal type photodetecting array) including the thermal detector according to any of the illustrated embodiments. In the example of FIG. 7, a plurality of photodetecting cells (e.g., the thermal detectors 200a to 200d) are disposed two-dimensionally. In order to select single photodetecting cells from among the plurality of photodetecting cells (thermal detectors 200a to 200d), scan lines (W1a, W1b, etc.) and data lines (D1a, D1b, etc.) are provided.

The thermal detector 200a that serve as a single photodetecting cell has an element-selection transistor T1a and a piezoelectric capacitor ZC that serves as the thermal type photodetecting element 5. The potential relationship of the two poles of the piezoelectric capacitor ZC can be inverted by switching the potential that is applied to PDr1 (by inverting this potential, it is not necessary to provide a mechanical chopper). Other photodetecting cells (the thermal detectors 200b to 200d) are similarly configured.

The potential of the data line D1a can be initialized by turning on a reset transistor T2. When reading a detection signal, the read transistor T3 is ON. The current that is generated as a result of the pyroelectric effect is converted to voltage by an I/V conversion circuit 510, amplified by an amplifier 600, and converted to digital data by an A/D converter 700.

In this embodiment, a plurality of thermal detectors is disposed two-dimensionally (for example, disposed in the form of an array along two respective perpendicular axes (X-axis and Y-axis)), thereby realizing a thermal detection device (thermal-type optical array sensor).

Electronic Instrument

Figure 8:
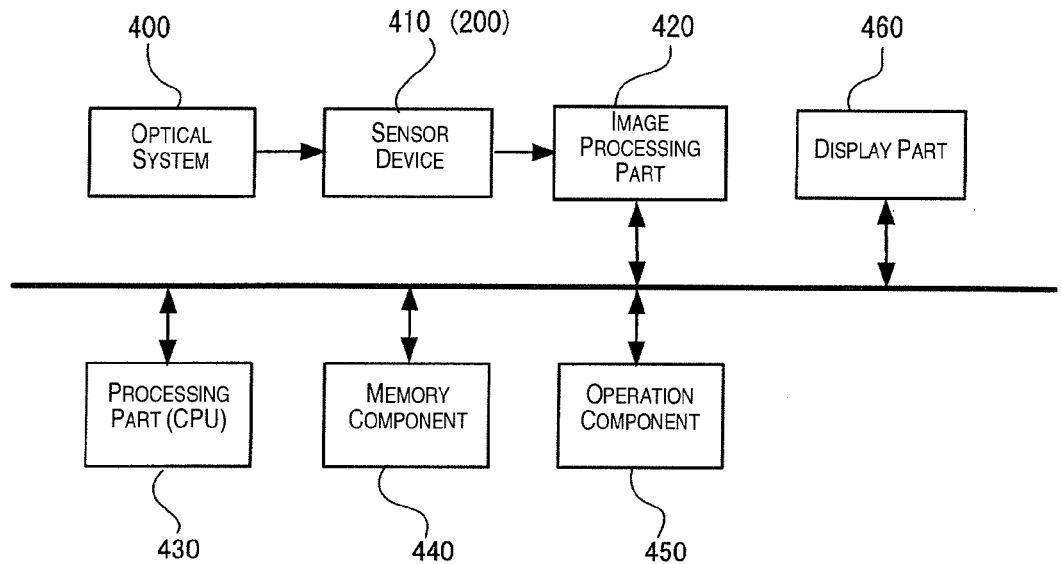
FIG. 8 is a diagram showing an example of the configuration of an electronic instrument.

FIG. 8 is a diagram showing an example of the configuration of an electronic instrument. Examples of the electronic instrument include an infrared sensor device, a thermographic device, and an on-board automotive night-vision camera or surveillance camera.

As shown in FIG. 8, the electronic instrument comprises an optical system 400, a sensor device 410 (corresponding to the thermal detector 200 or the thermal detection device as described above), an image processing part 420, a processing part 430, a memory component 440, an operation component 450, and a display part 460. The electronic instrument of this embodiment is not restricted to the configuration of FIG. 8, and various modified embodiment are possible in which some of the constituent elements (e.g., the optical system, operational, part, or display part) are omitted and other constituent elements are added.

The optical system 400 includes one or a plurality of lenses and driving parts for driving these lenses. Imaging and the like of the subject is carried out on the sensor device 410. In addition, focus adjustment may be carried out as necessary.

The sensor device 410 has a configuration in which the thermal detectors of the embodiments described above are laid out two-dimensionally, and a plurality of lines (scan lines (or word lines)) and a plurality of columns (data lines) are provided. The sensor device 410 can also comprise line selection circuits (line drivers), a read circuit for reading data from the photodetectors via the columns, an A/D converter, and the like, in addition to the photodetectors that are laid out two-dimensionally. Because data is sequentially read from photodetectors that are laid out two-dimensionally, a captured image of the subject can be processed.

Based on the digital image data (pixel data) from the sensor device 410, the image processing part 420 carries out various image processing operations such as image correction processing. The image processing part 420 corresponds to the control part that processes the output of the sensor device 410 (thermal detector 200). The processing part 430 carries out control of the respective elements of the electronic instrument and overall control of the electronic instrument. This processing part 430 is realized, for example, in a CPU or the like. The memory component 440 stores various types of information, and, for example, functions as a work space for the processing part 430 or the image processing part 420. The operation component 450 is used as an interface for a user to operate the electronic instrument and can be worked, for example, in the form of various buttons, a GUI (graphical user interface) screen, or the like.

The display part 460 displays the GUI screen, images that have been captured by the sensor device 410, and the like, and is worked in the form of various types of displays, such as a liquid crystal display or organic EL display.

By using the thermal detector of a single cell as a sensor such as an infrared light sensor in this manner and by disposing the thermal detector of each cell along two perpendicular axes, a sensor device (thermal type photodetecting device) 410 can be configured. When this is done, a thermal (light) distribution image can be captured. By using this sensor device 410, it is possible to configure an electronic instrument such as a thermographic device, or an on-board automotive night-vision camera or surveillance camera.

As described previously, the thermal detector according to the present invention has high light detection sensitivity. Thus, the performance of the electronic instrument in which the thermal detector is mounted is increased.

Figure 9:
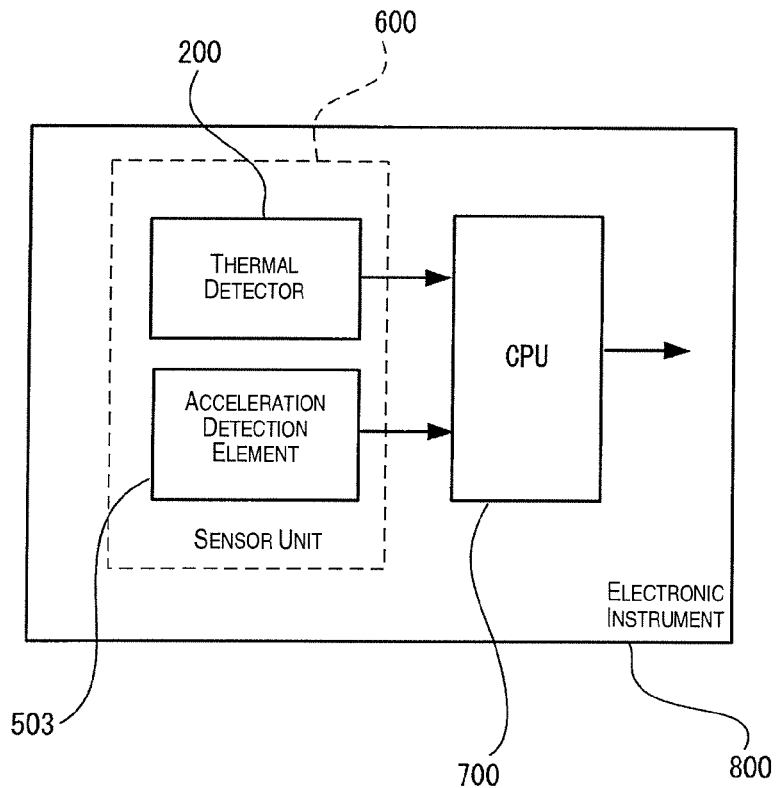
FIG. 9 is a diagram showing another example of the configuration of an electronic instrument.

FIG. 9 is a diagram showing another example of the configuration of the electronic instrument. The electronic instrument 800 of FIG. 9 comprises a thermal detector 200 and an acceleration detecting element 503 which are mounted in a sensor unit 600. The sensor unit 600 also can carry a gyro sensor or the like. Various types of physical quantities can be measured by the sensor unit 600. The various detection signals that are output from the sensor unit 600 are processed by a CPU 700. The CPU 700 corresponds to the control part configured to process the output of the thermal detector 200.

As described above, in accordance with the illustrated embodiments of the present invention, for example, the detection sensitivity of a thermal detector can be dramatically improved.

In addition, in the embodiments described above, an infrared detector that detects infrared light is used as an example of a thermal detector. However, it will be apparent from this disclosure that the thermal detector according to the present invention may be configured and arranged to detect other type of light such as terahertz light, for example.

General Interpretation of Terms

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Also as used herein to describe the above embodiments, the following directional terms "top", "bottom", "upper", "lower", "forward", "rearward", "above", "downward", "vertical", "horizontal", "below" and "transverse" as well as any other similar directional terms refer to those directions of the thermal detector when the thermal detector is oriented as shown in FIG. 1B. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. All modifications such as described above may be understood to fall within the scope of the invention. Terms disclosed together with different equivalent or broader terms in at least one instance in the specification or drawings, for example, may be replaced by these different terms at any place in the specification or drawings.

What is claimed is:

1. A thermal detector comprising:
a substrate;
a support member supported on the substrate so that a cavity is formed between the substrate and the support member;
a heat-detecting element supported on the support member;
a thermal transfer member including a connecting portion connected to the heat-detecting element and a thermal collecting portion formed over the heat-detecting element and having a surface area larger than a surface area of the connecting portion as seen in plan view;
a first light-absorbing layer contacting the thermal transfer member and disposed between the thermal transfer member and the support member; and
a second light-absorbing layer contacting the thermal transfer member and disposed on the thermal transfer member.

2. The thermal detector according to claim 1, wherein
the first light-absorbing layer and the second light-absorbing layer are disposed around the heat-detecting element supported on the support member.

3. The thermal detector according to claim 2, wherein
a first optical resonator for a first wavelength is formed between a surface of the support member on which the heat-detecting element is mounted and an upper surface of the second light-absorbing layer, and
a second optical resonator for a second wavelength that is different from the first wavelength is formed between a lower surface of the second light-absorbing layer and the upper surface of the second light-absorbing layer.

4. The thermal detector according to claim 1, wherein
the thermal transfer member also serves as wiring that electrically connects the heat-detecting element to another element.

5. The thermal detector according to claim 3, wherein
the heat-detecting element is a pyroelectric capacitor element,
a distance between the surface of the support member on which the heat-detecting element is mounted and the upper surface of the second light-absorbing layer is set to $n \cdot (\lambda 1/4)$, where n is an integer equal to or greater than 1 and $\lambda 1$ is the first wavelength,
a distance between the lower surface of the second light-absorbing layer and the upper surface of the second light-absorbing layer is set to $n \cdot (\lambda 2/4)$, where $\lambda 2$ is the second wavelength, and
the thermal transfer member is made from aluminum nitride or aluminum oxide.

6. A thermal detection device comprising a plurality of the thermal detectors according to claim 1 arranged two-dimensionally.

7. A thermal detection device comprising a plurality of the thermal detectors according to claim 2 arranged two-dimensionally.

8. A thermal detection device comprising a plurality of the thermal detectors according to claim 3 arranged two-dimensionally.

9. A thermal detection device comprising a plurality of the thermal detectors according to claim 4 arranged two-dimensionally.

10. A thermal detection device comprising a plurality of the thermal detectors according to claim 5 arranged two-dimensionally.

11. An electronic instrument comprising:
the thermal detector according to claim 1; and
a control part configured to process an output of the thermal detector.

12. An electronic instrument comprising:
the thermal detector according to claim 2; and
a control part configured to process an output of the thermal detector.

13. An electronic instrument comprising:
the thermal detector according to claim 3; and
a control part configured to process an output of the thermal detector.

14. An electronic instrument comprising:
the thermal detector according to claim 4; and
a control part configured to process an output of the thermal detector.

15. An electronic instrument comprising:
the thermal detector according to claim 5; and
a control part configured to process an output of the thermal detector.

16. A thermal detector manufacturing method comprising:
forming a structure including an insulating layer on a surface of a substrate;
forming a sacrificial layer on the structure including the insulating layer;
forming a support member on the sacrificial layer;
forming a heat-detecting element on the support member;
forming a first light-absorbing layer so as to cover the heat-detecting element, and then planarizing the first light-absorbing layer;
forming a contact hole in a part of the first light-absorbing layer, subsequently forming a material layer having thermal conductivity, and patterning the material layer to form a thermal transfer member having a connecting portion that connects to the heat-detecting element and a thermal collecting portion having a surface area that is greater than that of the connecting portion as seen in plan view;
forming a second light-absorbing layer over the first light-absorbing layer and the thermal transfer member;
patterning the first light-absorbing layer and the second light-absorbing layer;
patterning the support member; and
removing the sacrificial layer to form a cavity between the support member and the structure including the insulating layer formed on the surface of the substrate.

17. The thermal detector according to claim 1, wherein
the thermal detector is configured and arranged to detect infrared light.

18. The thermal detector according to claim 1, wherein
the thermal detector is configured and arranged to detect terahertz light.

19. The thermal detection device according to claim 6, wherein
the thermal detectors are configured and arranged to detect infrared light.

20. The thermal detection device according to claim 6, wherein
the thermal detectors are configured and arranged to detect terahertz light.

* * * * *